US011252841B1

(12) United States Patent
Alshareef

(10) Patent No.: US 11,252,841 B1
(45) Date of Patent: Feb. 15, 2022

(54) HEAT SINK WITH SLOTTED PIN FINS

(71) Applicant: GIFTEDNESS AND CREATIVITY COMPANY, Safat (KW)

(72) Inventor: Sultan M S M Z Alhamed Alshareef, Safat (KW)

(73) Assignee: GIFTEDNESS AND CREATIVITY COMPANY, Safat (KW)

( * ) Notice: Subject to any disclaimer, the term of this patent is extended or adjusted under 35 U.S.C. 154(b) by 0 days.

(21) Appl. No.: 17/178,594

(22) Filed: Feb. 18, 2021

(51) Int. Cl.
*H05K 7/20* (2006.01)
*H01L 23/367* (2006.01)
*F28F 13/00* (2006.01)

(52) U.S. Cl.
CPC ........... *H05K 7/2039* (2013.01); *F28F 13/00* (2013.01); *H01L 23/3677* (2013.01)

(58) Field of Classification Search
CPC ............. H05K 7/20154; H05K 7/2039; H05K 7/20509; H05K 1/0201–0203; H01L 23/3677
USPC ................. 361/697, 709, 710, 719; 165/80.3
See application file for complete search history.

(56) References Cited

U.S. PATENT DOCUMENTS

| 5,158,136 | A | | 10/1992 | Azar | |
|---|---|---|---|---|---|
| 5,351,748 | A | * | 10/1994 | Dagan | F28F 3/022 165/185 |
| 6,244,331 | B1 | | 6/2001 | Budelman | |
| 6,374,490 | B1 | * | 4/2002 | Miyahara | B21D 22/04 29/557 |
| 6,807,059 | B1 | | 10/2004 | Dale | |
| 6,817,405 | B2 | * | 11/2004 | Kamath | F28F 3/022 165/185 |
| 8,018,720 | B2 | * | 9/2011 | Campbell | F28F 3/022 361/700 |
| 9,801,306 | B2 | * | 10/2017 | Siracki | B23P 15/26 |

FOREIGN PATENT DOCUMENTS

JP 2006114688 A 4/2006

OTHER PUBLICATIONS

Dhaiban, Hussein T., et al. "The Optimal Design of Heat Sinks: A Review." Journal of Applied and Computational Mechanics 6.4 (2020): 1030-1043.
Al-Damook et al., "Computational design and optimiation of pin fin heat sinks with rectangular perforations", Applied Thermal Engineering (2016), vol. 105, pp. 691-703.
Ahmed et al., "Optimization of thermal designs of heat sinks", International Journa! of Heat and Mass Transfer (2018), vol. 118, pp. 129-153.

\* cited by examiner

*Primary Examiner* — Zachary Pape
(74) *Attorney, Agent, or Firm* — Nath, Goldberg & Meyer; Richard C. Litman

(57) ABSTRACT

The heat sink with slotted pin fins includes a thermally conductive base and a plurality of pin fins, which may be substantially cylindrical. Each pin fin has axially opposed upper and lower ends, the lower ends being attached to the base. Each of the pin fins is formed of a thermally conductive material and extends from the base. Each of the pin fins has a slot formed therein extending both diametrically and axially through the pin fin, such that a surrounding fluid medium can flow through the slot formed through pin fin, thus reducing the drag force on the surrounding fluid medium as it impinges upon and flows through the pin fins, increasing the rate of thermal transfer.

4 Claims, 4 Drawing Sheets

HEAT SINK WITH SLOTTED PIN FINS

BACKGROUND

1. Field

The disclosure of the present patent application relates to heat sinks, and particularly to a heat sink with slotted pin fins.

2. Description of the Related Art

Electronic components or devices generate heat locally. In order to prevent damage to the electronic components, this heat must be removed. In general, the more efficient the thermal transfer away from the electronic component or device, the better the performance and reliability. The heat generated by electronic components can be transported to other places or locations through the use of thermally conductive materials or devices, such as heat pipes. However, eventually, the heat has to be dumped to the surrounding fluid medium via some form of heat sink. The efficiency of the heat transfer to the surrounding medium by the heat sink depends on the geometry of the heat sink, the contact surface with the air (or other fluid medium), the flow field around the heat sink, and the material properties of air. The transfer of heat from the heat sink to the air is usually one of the major thermal resistances of the full thermal system.

FIG. 2 illustrates a typical pin fin heat sink 100, which includes a plurality of round pin-shaped fins 114, each with opposed upper and lower ends 115, 117, respectively. The lower ends 117 are secured to, and in thermal communication with, a thermally conductive base 112. The plurality of pin-shaped fins 114 project outward and substantially perpendicular to the base 112, and are also formed from a thermally conductive material. As the surrounding fluid medium, which may be air, for example, flows through, over and around the pin-shaped fins 114, heat is transferred into the fluid medium, drawing it away from the base 112, which is typically mounted on an electronic component, electronic device, heat pipe or the like.

The basic arrangement of the pin fin heat sink 100 is highly reliant on the volume and rate of the surrounding fluid medium when it comes to heat transfer rate and efficiency. However, drag of the fluid as it impinges upon, and flows around, the plurality of pin-shaped fins 114 not only decreases the rate of heat transfer, but can also create unwanted turbulence, vortices, etc. in the flowing fluid, which can reduce efficiency even further, as well as increasing the potential for damage to the system driving the fluid to flow. The rate of heat transfer is further limited by the surface area of the pin-shaped fins 114 and the base 112. Thus, a heat sink with slotted pin fins solving the aforementioned problems is desired.

SUMMARY

The heat sink with slotted pin fins includes a thermally conductive base and a plurality of substantially cylindrical pin fins. Each substantially cylindrical pin fin has axially opposed upper and lower ends. The lower ends are secured to, and in thermal communication with, the thermally conductive base. Each of the substantially cylindrical pin fins is formed of a thermally conductive material and projects outward from the thermally conductive base. Each of the substantially cylindrical pin fins has a slot formed therethrough, extending both diametrically and axially through the body of the substantially cylindrical pin fin, such that the surrounding fluid medium can flow through the slot formed in the body of the substantially cylindrical pin fin, thus reducing the drag force on the surrounding fluid medium as it impinges upon, and flows through, the plurality of substantially cylindrical pin fins, and increasing the rate of thermal transfer. The slot increases the surface area provided for heat transfer.

In an alternative embodiment, the diametrically-extending slot is replaced by a cruciform-shaped slot, having a substantially plus-shaped or X-shaped cross-section, such that the slot is formed diametrically across two perpendicular directions. In a further alternative embodiment, the slot is replaced by a pair of parallel slots, which each extend substantially diametrically through the body, i.e., the pair of parallel slots are close together and are arranged directly on either side of the diameter of the substantially cylindrical body. The pair of slots approximately doubles the surface area provided by the slot of the first embodiment.

It should be understood that the above embodiments may be used with any suitable type of flow of the surrounding fluid medium, such as forced convective flow/heat transfer, cross-flow, jet impingement flow, internal/external flow, inline/staggered configurations, natural convection and the like.

These and other features of the present subject matter will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
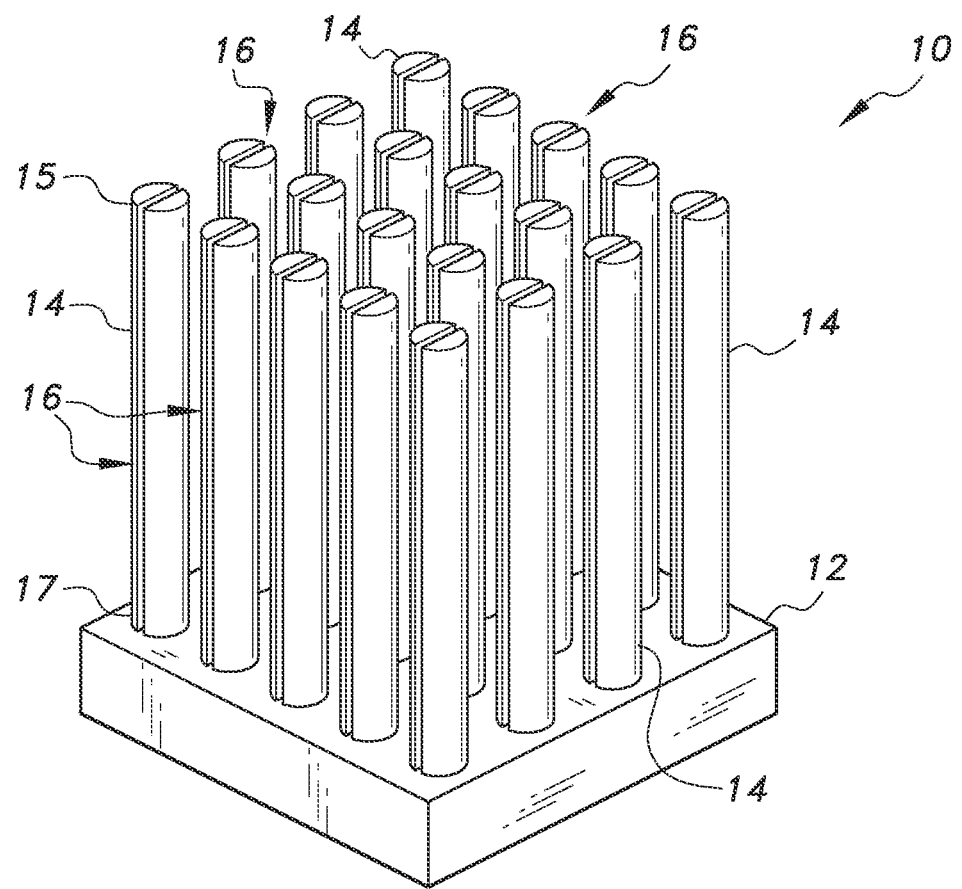
FIG. 1A is a perspective view of a first embodiment of a heat sink with slotted pin fins, having a single slot defined in the pin.
Figure 1B:
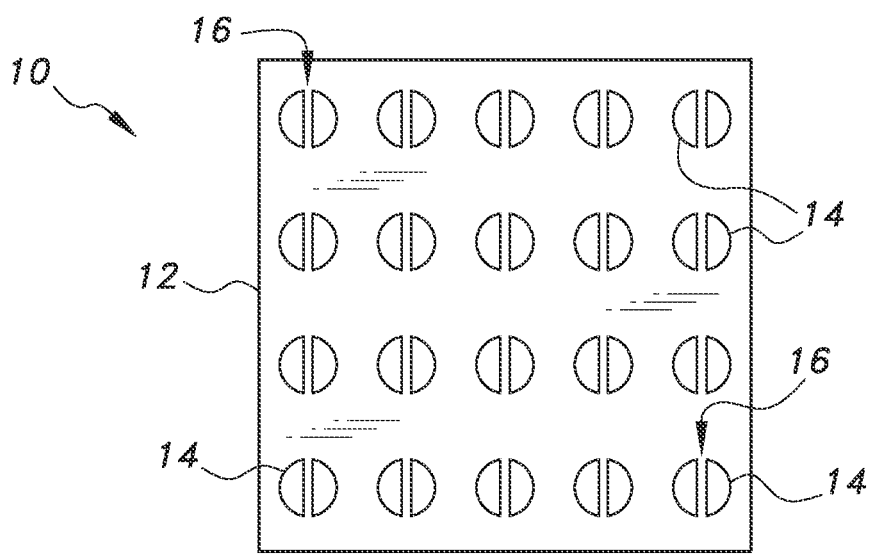
FIG. 1B is a top view of the heat sink of FIG. 1A.
Figure 2:
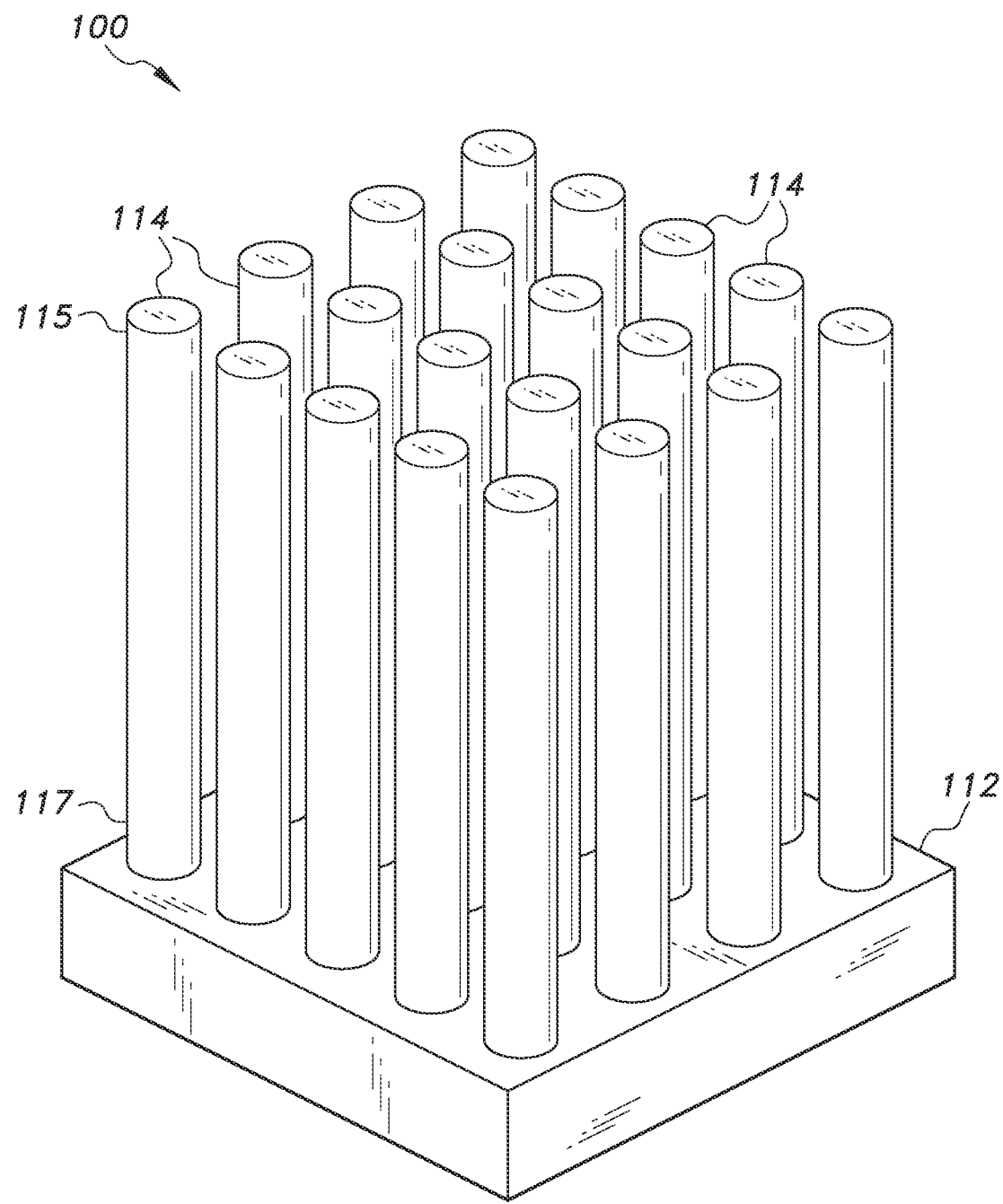
FIG. 2 is perspective view of a pin fin heat sink of the prior art.

Referring to FIGS. 1A and 1B, the heat sink with slotted pin fins 10 includes a thermally conductive base 12 and a plurality of substantially cylindrical pin fins 14 extending from the base. It should be understood that the thermally conductive base 12 may be formed from any suitable type of thermally conductive material, such as aluminum, copper, or other material typically found in heat sinks. Each substantially cylindrical pin fin 14 has axially-opposed upper and lower ends 15, 17, respectively. The lower ends 17 are attached to, and in thermal communication with, the thermally conductive base 12. Each of the substantially cylindrical pin fins 14 is formed of a thermally conductive material and projects outward from the thermally conductive base 12. It should be understood that each of the substantially cylindrical pin fins 14 may be formed from any suitable type of thermally conductive material, such as aluminum, copper, or other material typically found in heat sinks. Further, although shown as being round or cylindrical in FIGS. 1A and 1B, it should be understood that each of the pin fins 14 may have a cross-section that deviates from being perfectly circular. Examples of cross-sections include slightly oblong, elliptical, oval, polygonal, and the like. Further, although the pin fins 14 are shown extending perpendicular to the thermally conductive base 12, it should be understood that they may be slightly angled.

Each of the pin fins 14 has a slot 16 defined therein, the slot 16 extending both diametrically and axially through the body of the pin fin 14. In use, the surrounding fluid medium can flow through the slot 16, thus reducing the drag force of the surrounding fluid medium as it impinges upon, and flows through, the plurality of pin fins 14, increasing the rate of thermal transfer. The slot 16 increases the surface area across which the heat transfer takes place.

Figure 3:
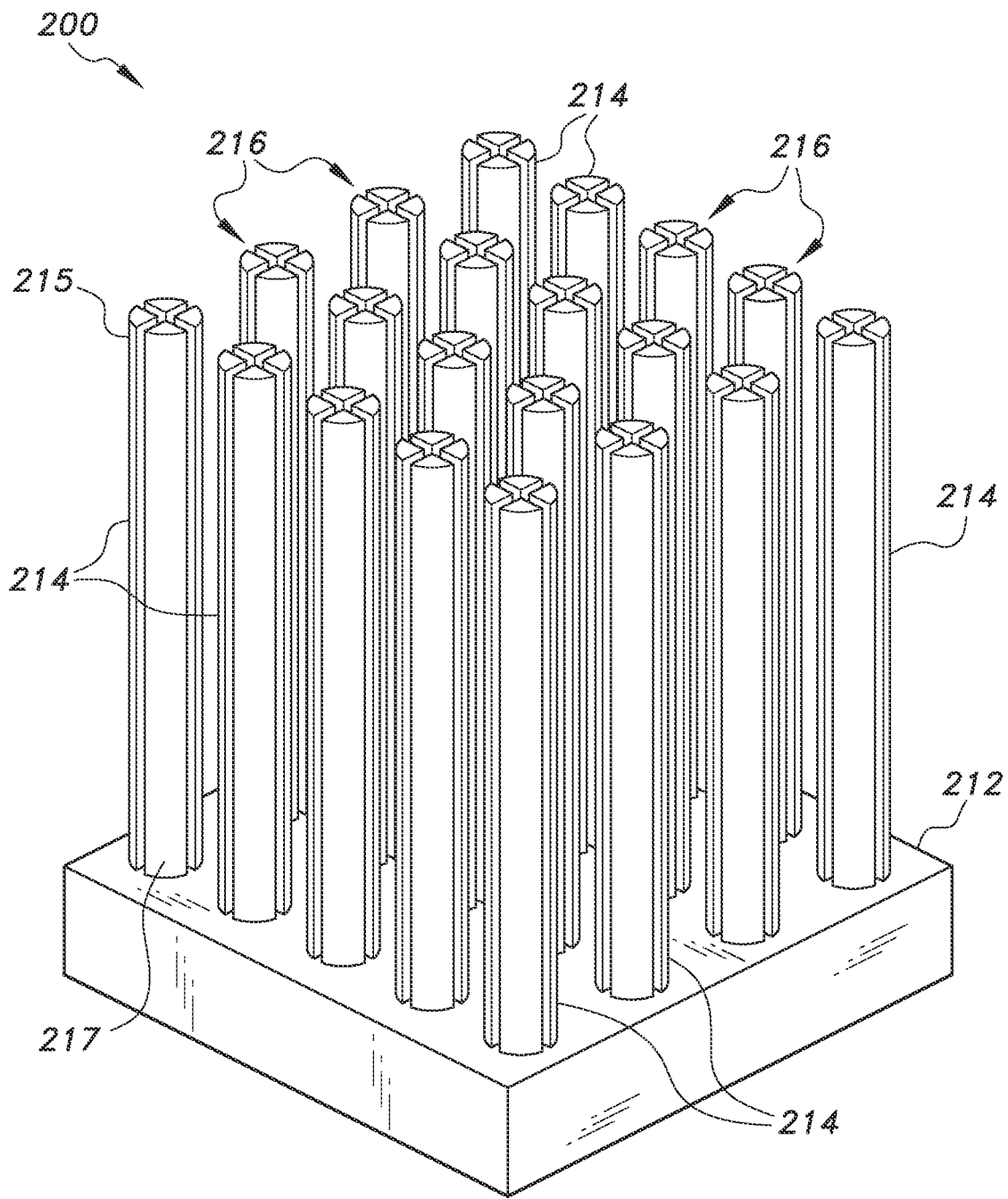
FIG. 3 is a perspective view of an alternative embodiment of a heat sink with slotted pin fins, having orthogonal slots defined in the pin.

In the alternative embodiment of FIG. 3, the heat sink 200 also includes a thermally conductive base 212, similar to thermally conductive base 12 of the previous embodiment, and a plurality of round or substantially cylindrical pin fins 214. As in the previously embodiment, each substantially cylindrical pin fin 214 has axially-opposed upper and lower ends 215, 217, respectively, and the lower ends 217 are attached to, and in thermal communication with, the thermally conductive base 212. Each of the pin fins 214 is formed of a thermally conductive material and extends from the thermally conductive base 212. It should be understood that each of the pin fins 214 may be formed from any suitable type of thermally conductive material, such as those typically found in heat sinks.

Further, although shown as being cylindrical in FIG. 3, it should be understood that each of the pin fins 214 may have a cross-section that deviates from being circular. Examples of cross-sections include slightly oblong, elliptical, oval, polygonal, and the like. Further, although the pin fins 214 are shown extending perpendicular to the base 212, it should be understood that they may be slightly angled. In the embodiment of FIG. 3, the diametrically-extending slot 16 of FIGS. 1A and 1B is replaced by orthogonal slots 216, having a substantially cruciform or X-shaped cross-section, such that the slot 216 is formed diametrically across two perpendicular directions. The cruciform shape of the slots 216 approximately doubles the additional surface area provided by the slot 16 of the embodiment of FIGS. 1A and 1B.

Figure 4A:
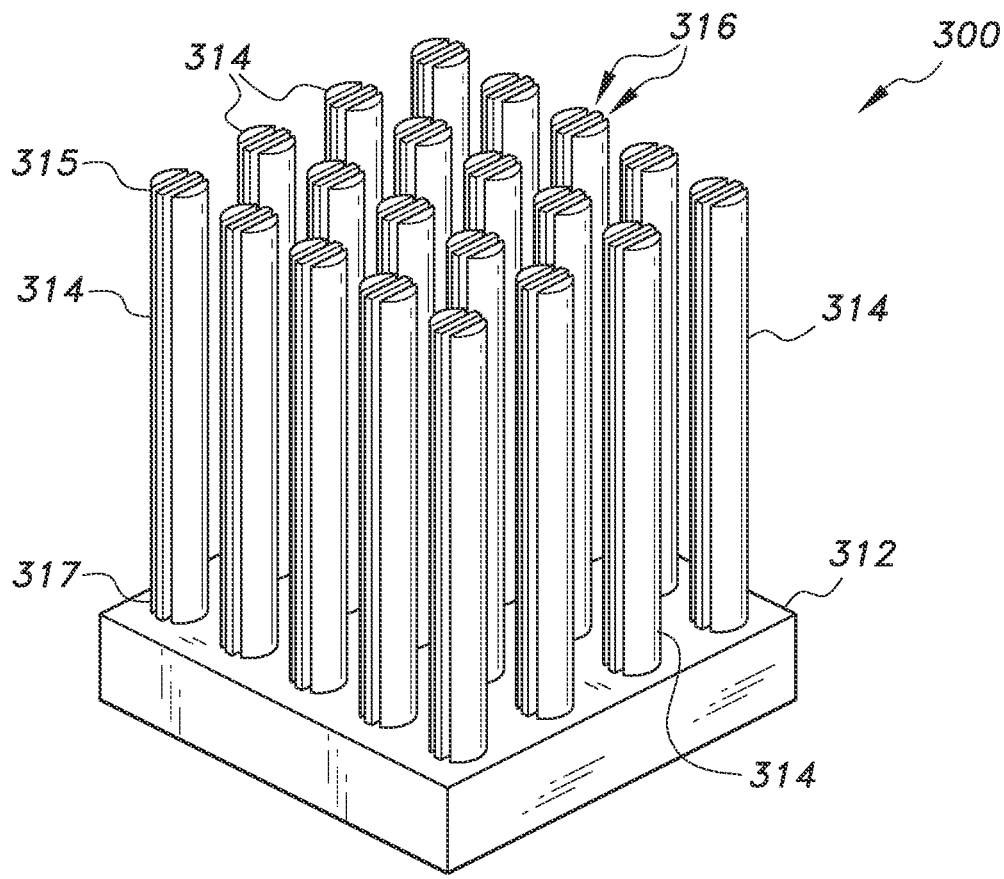
FIG. 4A is a perspective view of another alternative embodiment of a heat sink with slotted pin fins, having a pair of parallel slots.
Figure 4B:
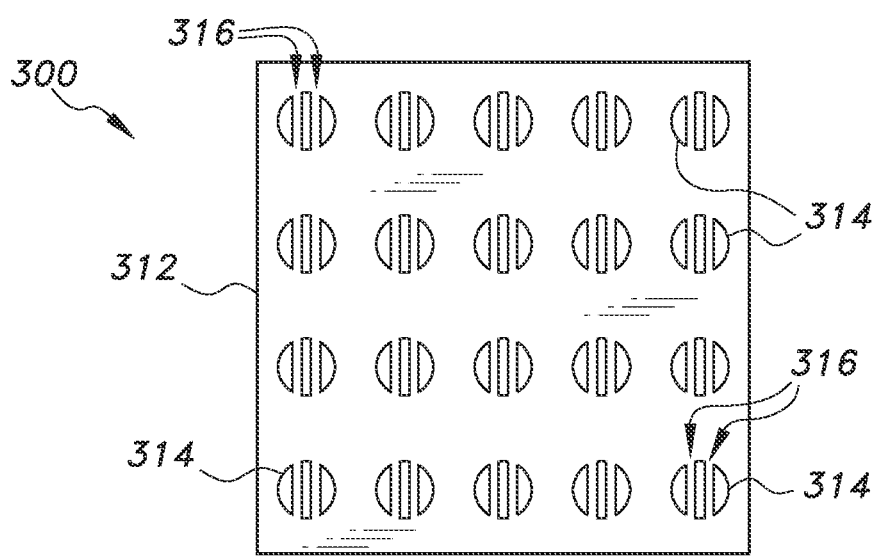
FIG. 4B is a top view of the heat sink of FIG. 4A.

In the embodiment of FIGS. 4A and 4B, the heat sink with slotted pin fins 300 also includes a thermally conductive base 312, similar to the thermally conductive bases 12 and 212 of the previous embodiments, and a plurality of substantially cylindrical pin fins 314. As in the previous embodiments, each pin fin 314 has axially-opposed upper and lower ends 315, 317, respectively, and the lower ends 317 are attached to, and in thermal communication with, the base 312. Each of the pin fins 314 is formed of a thermally conductive material and extends from the base 312. It should be understood that each of the pin fins 314 may be formed from any suitable type of thermally conductive material, such as those typically found in heat sinks.

Further, although shown as being cylindrical in FIGS. 4A and 4B, it should be understood that each of the pin fins 314 may have a cross section that deviates from being circular. Examples of cross-sections include slightly oblong, elliptical, oval, polygonal, and the like. Further, although the substantially cylindrical pin fins 314 are shown projecting perpendicular to the base 312, it should be understood that they may be slightly angled. In the embodiment of FIGS. 4A and 4B, the diametrically-extending slot 16 of FIGS. 1A and 1B is replaced by a pair of parallel slots 316 that each extend substantially diametrically through the body, i.e., the parallel slots 316 are close together and are arranged directly on either side of the diameter of the substantially cylindrical body. The pair of slots 316 approximately doubles the surface area provided by the slot 16 of the embodiment of FIGS. 1A and 1B.

It should be understood that the above embodiments of the heat sink with slotted pin fins may be used with any suitable type of flow of the surrounding fluid medium, such as forced convective flow/heat transfer, impingement flow, natural convection, and the like.

It is to be understood that the heat sink with slotted pin fins is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

I claim:

1. A heat sink with slotted pin fins, comprising:
a thermally conductive base; and
a plurality of solid heat conducting pin fins extending from the base parallel to each other, each of the heat conducting pin fins having a peripheral outer surface and axially opposed upper and lower ends, each of the heat conducting pin fins being attached to the thermally conductive base at their lower ends, each of the pin fins being formed of a thermally conductive material and having at least one slot defined therein, the at least one slot extending axially through the peripheral outer surface of the heat conducting pin fin from the upper end to the lower end and defining a continuous passage for flow of surrounding cooling medium through the heat conducting pin fin, wherein the at least one slot is oriented to admit the surrounding cooling medium moving in a first direction substantially parallel to the thermally conductive base, further wherein the at least one slot comprises two slots extending parallel to each other across the pin fin.

2. The heat sink as recited in claim 1, wherein each said pin fin extends substantially perpendicular to the base.

3. The heat sink as recited in claim 1, wherein each said pin fin is cylindrical.

4. A heat sink with slotted pin fins, comprising:
a thermally conductive base; and
a plurality of solid heat conducting pin fins extending from the base parallel to each other, each of the heat conducting pin fins having a peripheral outer surface and axially opposed upper and lower ends, each of the heat conducting pin fins being attached to the thermally conductive base at their lower ends, each of the pin fins being formed of a thermally conductive material and having at least one slot defined therein, the at least one slot extending axially through the peripheral outer surface of the heat conducting pin fin from the upper end to the lower end and defining a continuous passage for flow of surrounding cooling medium through the heat conducting pin fin, wherein the at least one slot is oriented to admit the surrounding cooling medium moving in a first direction substantially parallel to the thermally conductive base, further wherein the at least one slot comprises two slots extending orthogonal to each other across the pin fin, defining a cruciform slot and orthogonal passages for flow of surrounding medium through the pin fin.

\* \* \* \* \*